Aug. 26, 1958 R. E. LEISTER 2,849,607
FREQUENCY SHIFT RECEIVER
Filed April 21, 1953
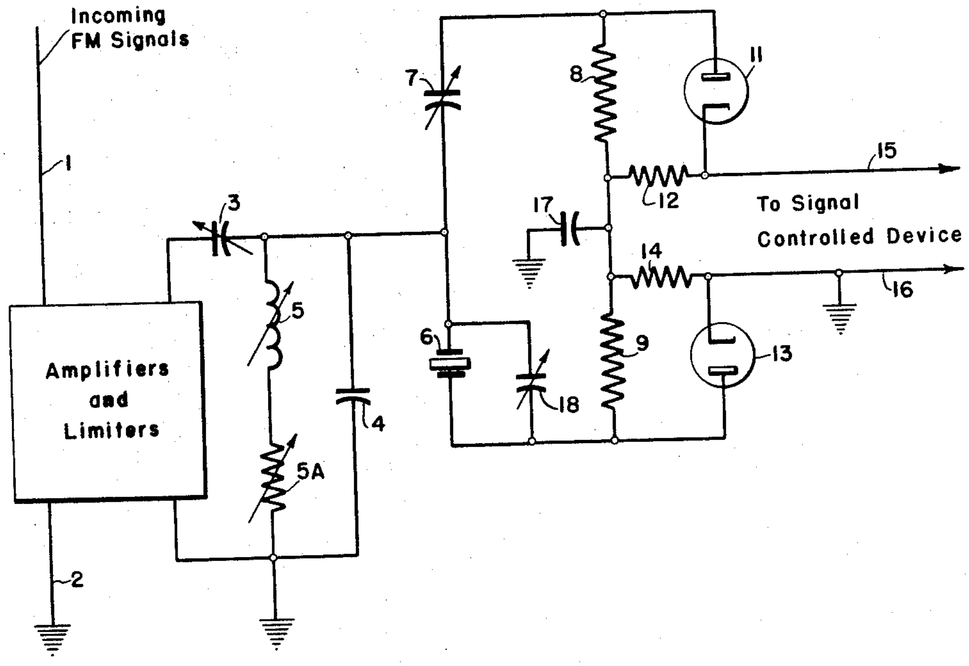
WITNESSES:
John E. Heasley
Wm. T. Wofford
INVENTOR
Robert E. Leister.
BY F. E. Browder
ATTORNEY 2,849,607
Patented Aug. 26, 1958

1

2,849,607

FREQUENCY SHIFT RECEIVER

Robert E. Leister, Baltimore, Md., assignor to Westinghouse Electric Corporation, East Pittsburgh, Pa., a corporation of Pennsylvania Application April 21, 1953, Serial No. 350,046

4 Claims. (Cl. 250—27)

My invention relates to detectors for frequency-modulated radio transmission systems and in particular relates to detectors for reception of code signals which shift from one carrier frequency to a nearby frequency in accordance with the code being transmitted. Systems of such a type are employed, for example, in telemetering or other code signalling by carrier current over electric power lines. Because of the large number of different signals which it is usually desired to be able to transmit simultaneously in a narrow frequency spectrum, it is desirable to have the percentage shift for any one signal limited to a very small value; hence the detector of such signals must discriminate between carrier frequencies which differ only very slightly.

One object of my invention is accordingly to provide a novel and improved detector for frequency modulated signals.

Another object is to provide a new and improved detector for signals of the so-called frequency-shift type in which the signals are formed by shifts from one to the other of two carrier frequencies.

Another object is to provide an improved type of receiver for transmission line and other carrier code signals.

Another object is to provide a balanced discriminator particularly useful in frequency-shift signal service.

Still another object is to provide a novel arrangement for balancing the positive and negative values of the output voltage of a discriminator for frequency shift receivers.

Other objects of my invention will become apparent upon reading the following description taken in connection with the drawings in which the single figure is a schematic circuit diagram of the discriminator for frequency-modulated sgnals in accordance with my invention.

Referring to the drawing in detail, there is impressed on the terminals 1, 2 a signal which comprises a carrier wave which shifts from frequency $f_1$ to frequency $f_2$ in accordance with a code such as dot-and-dash telegraph, telemeter, or the like. These carrier frequencies in accordance with present practice are of the order of 30 to 200 kilocycles and the amount of shift is in the order of 50 to 150 cycles depending on the carrier frequency, these values being given merely as typical illustrations.

After passing through amplifiers and limiters of ordinary type, the signals are impressed through capacitor 3 on a network comprising a capacitor 4 bypassed by an inductor 5 in series with a variable resistor 5A. The common terminal of capacitors 3 and 4 and inductor 5 are connected to the junction of a piezo-electric crystal 6 and a variable cpacitor 7, the free terminals of which are interconnected through a pair of equal resistors 8 and 9. The piezo-electric crystal 6 is shunted by a variable capacitor 18. The resistor 8 is shunted by a rectifier 11 in series with a resistor 12, and the resistor 9 is shunted by an identical rectifier 13 and resistor 14. An output circuit 15, 16 to some work device like a relay tube or an electric meter is connected between the common junctions of the respective identical rectifiers and resistors. The common junction of rectifier 13 and resistor 14 is grounded, while the common junction of resistors 8 and 9 is grounded for radio frequencies through a capacitor 17.

To attain the sharpness of discrimination required, I employ certain properties of piezo-electric crystals. Such crystals have the useful feature of acting like an ordinary capacitor except at two rather closely-spaced frequencies; at one of these the crystals act like series resonant circuit elements while at the other they exhibit the high impedance of a parallel resonant circuit. By properly orienting the cut of the crystal 6, I make its series resonant properties occur at one of the carrier frequencies and its parallel resonant properties occur at the other of the carrier frequencies between which the signals shift, and thereby attain a detector which is sharply responsive to the signals being transmitted and insensitive to signals or disturbances of any other frequency.

By adjusting capacitor 7 to a value equal to the capacitance exhibited by crystal 6 at all frequencies other than those critical values, $f_1$ and $f_2$ between which the carrier shifts the circuit 6, 7, 8, 9, 11, 12, 13, 14 is symmetrical, so that the direct current voltage of one polarity across resistor 12 just balances that across resistor 14, and the voltage produced across the output lines 15, 16 is zero.

When carrier of frequency $f_1$ arrives at input terminals 1, 2 the crystal 6 behaves as if it were series resonant, and its impedance falls to a very small value. This results in a current in resistor 14 much larger than that flowing through capacitor 7 to resistor 12, and the output line 15 stands at a negative voltage relative to line 16.

When now the incoming carrier shifts to its other critical frequency $f_2$, the crystal 6 acts like a parallel resonant circuit and takes on a high impedance to current flow through resistors 9 and 14 and rectifier 13. The voltage drop in resistor 14 thus drops to a very small value compared to that impressed through capacitor 7 and rectifier 11 on resistor 12, and output line 15 stands at a positive voltage relative to output line 16. The polarity of the voltage across the output lines 15 and 16 thus reverses in consonance with the incoming frequency shifted carrier.

It is advantageous to have the negative voltage present at the output lines 15, 16 when the carrier is at frequency $f_1$ identical in magnitude to that of the positive voltage which is present at output lines 15, 16 when the carrier is at frequency $f_2$.

When the carrier is at frequency $f_1$, the impedance of the radio frequency path through crystal 6, rectifier 13, load resistor 14 and by-pass capacitor 17 drops to a minimum value, since crystal 6 is then operating at its series resonant frequency. Now when the carrier is at frequency $f_2$, the impedance of the path above-mentioned, is at a maximum value, since the combination of crystal 6 and its shunt capacitor 18, is operating at the parallel resonant condition. Thus the load impedance which is presented to the combination of inductance 5, resistor 5A, and capacitor 4 by the discriminator circuit at carrier frequency $f_1$ is quite different from that which is presented when the carrier is at frequency $f_2$. Since the resistance and capacitance of a particular crystal such as crystal 6 cannot be varied over a large range of magnitudes at a particular channel frequency the problem of obtaining a positive voltage at output lines 15, 16 when the carrier is at frequency $f_2$ of sufficient magnitude to match the negative voltage present at the output lines 15, 16, when the carrier is at frequency $f_1$, becomes a serious one. However, I have found that by utilizing a discriminator voltage source having controlled regulation, this problem can be solved. For a parallel resonant circuit, as the Q is increased the voltage across the circuit will increase for any given excitation voltage, but the regulation will decrease.

Specifically, I control the regulation of the discriminator voltage source by varying the Q of the parallel resonant circuit comprising inductance 5, and capacitor 4, by means of variable resistance 5A. By adjusting the regulation of the parallel resonant circuit 4, 5 its voltage can be made to increase sufficiently to give the required positive voltage across output lines 15, 16 as the impedance presented by the circuit branch comprising the crystal 6, diode 13, resistor 14, and capacitor 17 decreases. Thus, by adjusting resistor 5A I obtain a discriminator input voltage which is such that when the carrier is at frequency $f_2$ a positive voltage will appear at the output lines 15, 16 of the correct magnitude to match the negative voltage present at the output lines 15, 16, when the carrier is at frequency $f_1$.

While I have shown my invention in only one form, it will be obvious to those skilled in the art that it is not so limited, but is suceptible of various changes and modifications without departing from the spirit thereof.

I claim as my invention:

1. In combination with a source of frequency modulated waves a circuit comprising a resonant circuit embodying an adjustable resistor, a capacitance and a piezo-electric crystal having a common junction connected to draw current directly from said resonant circuit, a pair of impedances connected in series between the free terminals of said capacitance and said crystal, a rectifier and a load resistor shunting each of said pair of impedances, said rectifiers being connected to produce oppositely poled voltages across said load resistors and said load resistors having a common terminal, a work circuit connected to shunt said load resistors, and a third impedance connecting the common terminal of said pair of impedances with said resonant circuit.

2. In combination with a source of frequency-modulated waves a circuit comprising a resonant circuit embodying means to adjust its Q, a capacitance and a piezo-electric crystal having a common junction connected to draw current directly from said resonant circuit, a pair of impedances connected in series between the free terminals of said capacitance and said crystal, a rectifier and a load resistor shunting each of said pair of impedances, said rectifiers being connected to produce oppositely poled voltages across said load resistors, and said load resistors having a common terminal, a work circuit connected to shunt said load resistors, and a third impedance connecting the common terminal of said pair of impedances with said resonant circuit.

3. In apparatus for discriminating between waves of two different frequencies, the combination of a parallel resonant circuit to which said waves are supplied, a pair of parallel current paths directly connected to said parallel resonant circuit, each path including a resistor shunted by a channel comprising a rectifying device and a load impedance adapted to have unidirectional potentials developed thereon in response to said waves, each path also serially including a current controlling element, one element being a piezo-electric crystal exhibiting series resonance and parallel resonance near said two frequencies respectively and substantially pure capacity reactance above and below said frequencies, the other element being a capacitance, output means responsive to the difference between potentials developed across said load impedances, said capacitance being adjusted to impress minimum resultant output potential on said output means at frequencies for which said crystal exhibits substantially pure capacity reactance, and means for adjusting the Q of said parallel resonant circuit.

4. In apparatus for discriminating between waves of different frequencies lying within a relatively narrow frequency band, a parallel resonant circuit for said waves, two parallel paths directly connected to said parallel resonant circuit, each path including a resistor shunted by a channel comprising a unilaterally conducting element and a load impedance adapted to have unidirectional potentials developed thereon in response to said waves, said elements being poled to permit current flow in the same direction relative to said parallel resonant circuit, one path further serially including a capacitance and the other path a piezo-electric crystal, said crystal exhibiting a relatively high impedance near one edge of said band and a relatively low impedance near the other edge of said band, means for adjusting said capacitance substantially to balance the currents through both paths at frequencies outside said band, output means responsive to the difference between unidirectional potentials developed across said load impedances, and means for adjusting the Q of said parallel resonant circuit.

References Cited in the file of this patent

UNITED STATES PATENTS

| | | |
|---|---|---|
| 2,397,840 | Crosby | Apr. 2, 1946 |
| 2,461,956 | Beckwith | Feb. 15, 1949 |
| 2,497,840 | Seeley | Feb. 14, 1950 |
| 2,606,250 | Mackey | Aug. 5, 1952 |

OTHER REFERENCES

Black: "Modulation Theory," Van Nostrand Company, Inc., New York, New York, 1953, pp. 28–30.